United States Patent
Chung et al.

(10) Patent No.: US 7,354,837 B2
(45) Date of Patent: Apr. 8, 2008

(54) FABRICATION METHOD FOR SINGLE AND DUAL GATE SPACERS ON A SEMICONDUCTOR DEVICE

(75) Inventors: Chao-Hsi Chung, Hsinchu County (TW); Chu-Chun Hu, Hsinchu County (TW); Chih-Cheng Wang, Kaohsiung County (TW)

(73) Assignee: ProMOS Technologies Inc., Hsinchu (TW)

( * ) Notice: Subject to any disclaimer, the term of this patent is extended or adjusted under 35 U.S.C. 154(b) by 230 days.

(21) Appl. No.: 11/217,369

(22) Filed: Sep. 2, 2005

(65) Prior Publication Data

US 2007/0015324 A1    Jan. 18, 2007

(30) Foreign Application Priority Data

Jul. 12, 2005    (TW)    ............... 094123538 A

(51) Int. Cl.
    *H01L 21/336*    (2006.01)
(52) U.S. Cl. ............... 438/303; 438/595; 257/E21.626
(58) Field of Classification Search ............... 438/587, 438/595, 197, 283
    See application file for complete search history.

(56) References Cited

U.S. PATENT DOCUMENTS 6,197,632 B1 *    3/2001    Bronner et al. ............. 438/241
6,500,765 B2 *    12/2002    Kao et al. ................... 438/694
6,727,543 B2 *    4/2004    Lin ............................. 257/314
6,737,308 B2 *    5/2004    Kim ............................. 438/197

OTHER PUBLICATIONS

Williams, K.R., Gupta, K.; "Etch Rates for Micromachining Processing—Part II", Journal of Microelectromechanical Systems, vol. 12, No. 6, Dec. 2003.*
Williams, K.R., Gupta, K.; "Etch Rates for Micromachining Processing", Journal of Microelectromechanical Systems, vol. 5, No. 4, Dec. 1996.*
Wolf. S., Tauber, R.N.; Silicon Processing for the VLSI Era vol. 1—Process Technology; Lattice Press; 2000.*
Chung, "Dual GC Spacer Process Flow", ProMOS DIT 1-T3, Nov. 12, 2004, pp. 1-6.

* cited by examiner

*Primary Examiner*—B. William Baumeister
*Assistant Examiner*—Bryan E Wilson
(74) *Attorney, Agent, or Firm*—Birch, Stewart, Kolasch & Birch, LLP

(57) ABSTRACT

A fabrication method for a semiconductor device is provided. A substrate has an array area with a first gate and a peripheral area with a second gate. First and second isolation layers made of different materials are sequentially formed to cover the first gate, the second gate and the substrate. A portion of the second isolation layer is removed to form spacers on sidewalls of the first and second gates and expose the first isolation layer on a top of the first gate, a top of the second gate, and a surface of the substrate. The spacers on the first isolation layer in the array area are removed. The first isolation layer on the top of the first gate and the surface of the substrate is removed, thereby leaving a portion of the first isolation layer covering on the sidewalls of the first gate.

6 Claims, 4 Drawing Sheets

FABRICATION METHOD FOR SINGLE AND DUAL GATE SPACERS ON A SEMICONDUCTOR DEVICE

BACKGROUND OF THE INVENTION

1. Field of the Invention

The present invention relates in general to a fabrication method for a semiconductor device. More particularly, it relates to forming gate spacers in an array area and a peripheral area.

2. Brief Discussion of the Related Art

MOSFETs have been continuously scaled down to gain improved device density, operating performance, and reduced fabrication cost for integrated circuits (ICs). With MOSFET channel length decreased, the gate of the MOSFET is barely able to switch off the conductive channel thereunder. This phenomenon is known as the short channel effect, which is especially significant when a MOSFET has a channel length less than 0.13 um.

In a dynamic random access memory (DRAM), for example, shrinkage of memory cells in array areas yields higher device density, better production efficiency, and lower product cost. This shrinkage, however, also enlarges the short channel effect on the transistors in peripheral areas, easily causing peripheral circuit to malfunction.

Therefore, novel technologies are needed for accommodating cells both in array and periphery areas to downsized memories.

SUMMARY OF THE INVENTION

A fabrication method for a semiconductor device is provided. A substrate has an array area and a peripheral area. The array area comprises a first gate and the peripheral area comprises a second gate. A first isolation layer is formed to cover the first gate, the second gate and the substrate. A second isolation layer is formed to cover the first isolation layer. The second isolation layer is made of a material different from the first isolation layer. A portion of the second isolation layer is removed to form spacers on sidewalls of the first and second gates and expose the first isolation layer on a top of the first gate, a top of the second gate, and a surface of the substrate. The spacers on the first isolation layer at the sidewalls of the first gate are removed. The first isolation layer on the top of the first gate and the surface of the substrate is removed, thereby leaving a portion of the first isolation layer covering on the sidewalls of the first gate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and the accompanying drawings, which are given by way of illustration only, and thus are not limitative of the present application, and in which.

DETAILED DESCRIPTION OF THE PREFERRED EMBODIMENTS

Figure 1:
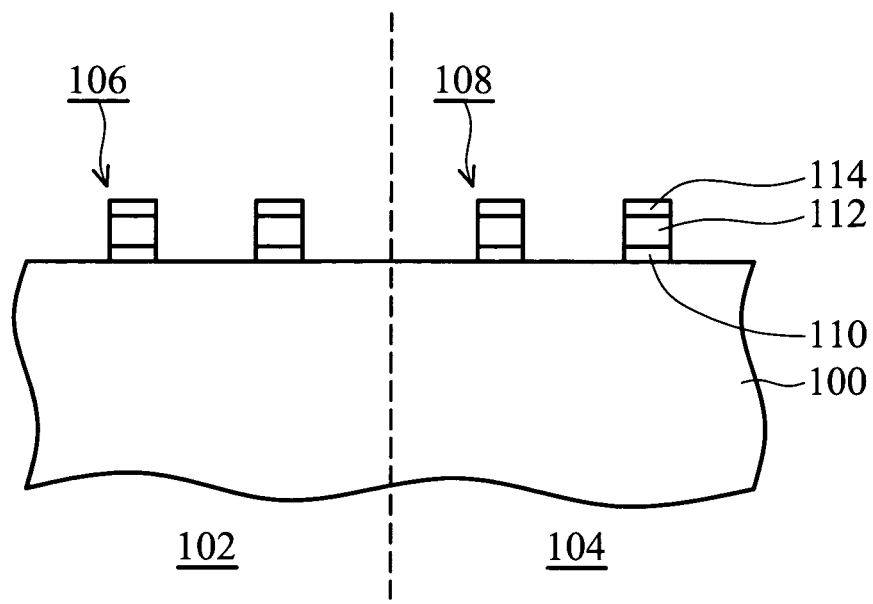
FIGS. 1 to 7 are cross sections regarding to forming spacers in an array area and a peripheral area according to an embodiment of the present invention.

Referring to FIG. 1, a semiconductor substrate 100, such as a silicon substrate, is provided. On the substrate 100, drain/source areas, channel regions, well regions or isolation regions can be formed according to well-known processes that, for the sake of brevity, are not described in detail herein.

The substrate 100 has an array area 102 and a peripheral area 104. Generally, memory cells are positioned in the array area 102 while logic control circuits are positioned in the peripheral area 104. Gates 106 are in array area 102 and gates 108 are in peripheral area 104. A gate is a major part of a MOSFET and can have a stacked structure comprising a gate dielectric layer 110, a gate electrode 112 and a gate cap layer 114. The gate dielectric layer 110 can be silicon oxide, silicon nitride, high-k isolation material, or the like. The gate electrode 112 can be polysilicon, silicide, metal, or the like. The gate cap layer 114 can be silicon nitride, or other dielectric material.

Figure 2:
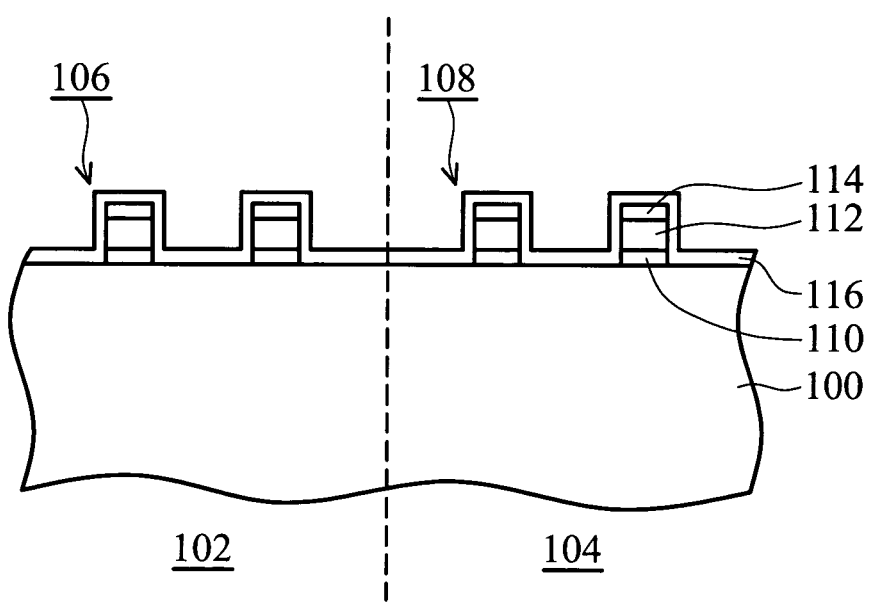

In FIG. 2, the gates 106 and 107 are treated by rapid thermal oxidation for gate protection prior to formation of an isolation layer 116, which covers the substrate 100 and the gates 106 and 108. The isolation layer 116, for example, can be formed by chemical vapor deposition (CVD), sub-atmospheric chemical vapor deposition (SACVD), low pressure chemical vapor deposition (LPCVD) or other deposition process to conformally deposit a silicon nitride layer. This silicon nitride layer can act as a buffer layer for subsequent processes while forming a self-aligned contact (SAC). The thickness of isolation layer 116 is about 20 to 30 nanometers (nm), and preferably 25 nm.

Figure 3:
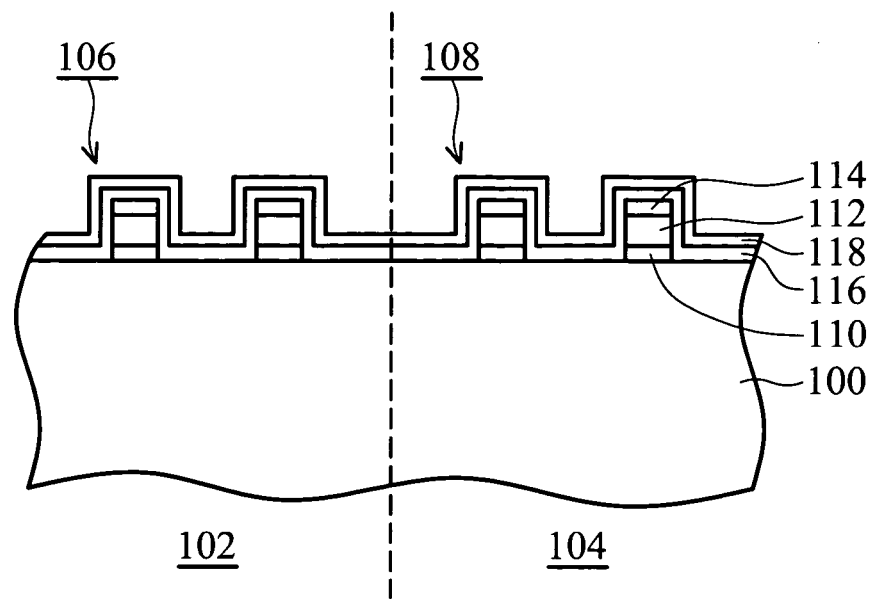

FIG. 3 shows the formation of an isolation layer 118 covering the isolation layer 116, where isolation layers 118 and 116 are made of different materials. The process for forming isolation layer 118 can be, for example, CVD, SACVD, LPCVD, furnace oxidation or other process to deposit a silicon oxide layer on the isolation layer 116. Furnace oxidation, which oxidizes a top portion of the isolation layer 116, has a relatively lower film formation rate. In comparison with furnace oxidation, SACVD or LPCVD has a greater film formation rate and is preferred. The thickness of isolation layer 118 ranges from about 20 to 40 nm, and preferably about 30 nm.

Figure 4:
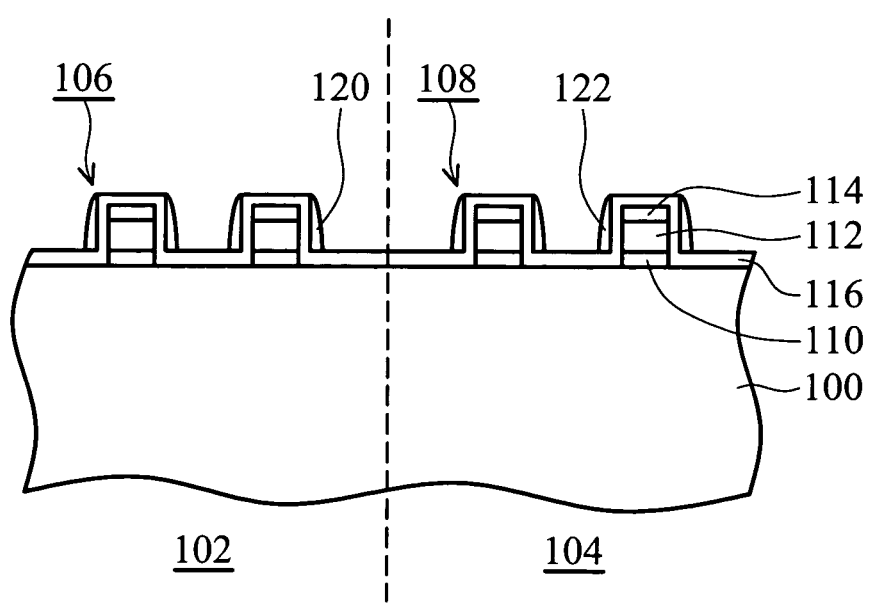

FIG. 4 shows that a portion of the isolation layer 118 is removed to form spacers 120 and 122 on the surface of the isolation layer 116 on sidewalls of the gates 106 and 108. Generally, a portion of the isolation layer 108 is removed by a semiconductor etching process. A dry etching process, for example, can perform an anisotropic etching to remove a portion of the isolation layer 118 and the remaining isolation layer 118 becomes spacers 120 and 122 on the sidewalls of the gates 106 and 108.

Figure 5:
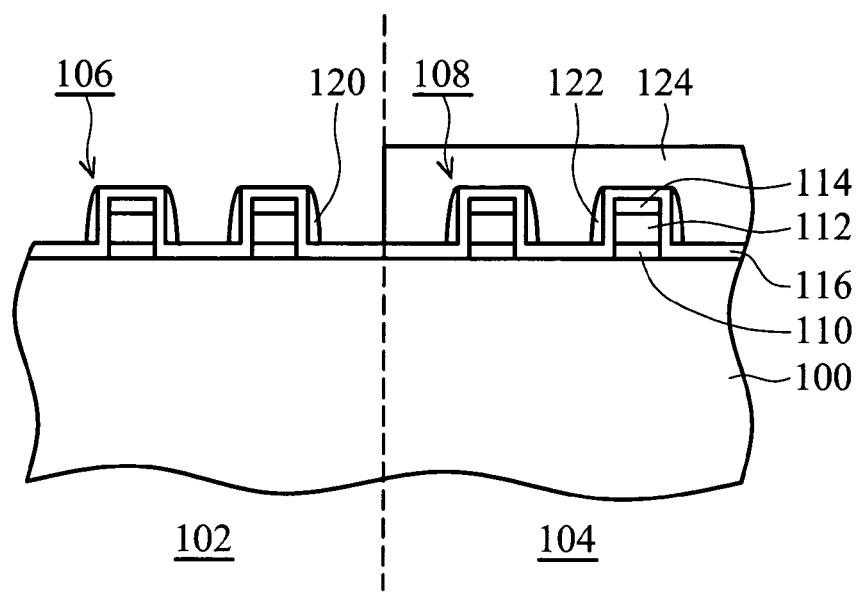
Figure 6:
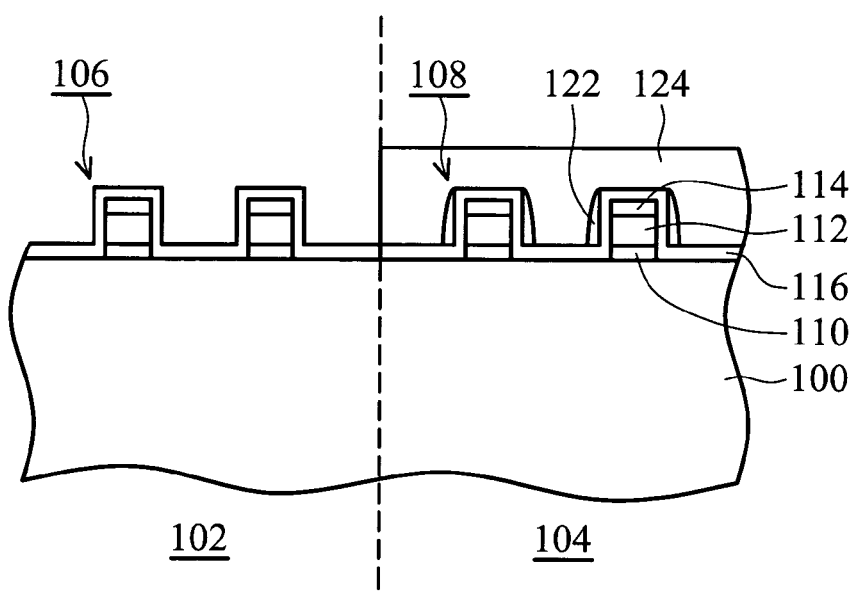

FIGS. 5 and 6 show the removal of the spacers 120 on the isolation layer 116 on the sidewalls of the gate 106. As shown in FIG. 5, a photolithography process can form a mask layer, such as a photoresist layer 124, to cover the peripheral area 104 and protect the gates 108, the isolation layer 116 and the spacers 122 thereon. The gate 106, the isolation layer 116 and the spacers 120 in the array area 102 are thus exposed.

As shown in FIG. 6, the spacers 120 are removed by, for example, an etch process. In this embodiment, since the isolation layers 116 and 118 are respectively silicon nitride and silicon oxide, a solution of buffered hydrofluoric acid (BHF) can be used to remove spacers 120 in the array area 102. BHF has a relatively high etching selectivity for silicon oxide over silicon nitride, and therefore can completely remove the spacers 120 of silicon oxide while leaving the isolation layer 116 of silicon nitride. The clearance of spacers 120 benefits the yield of fabricating integrated circuits. An alternative solution for removing spacers 120 is diluted HF (DHF) or the like.

Figure 7:
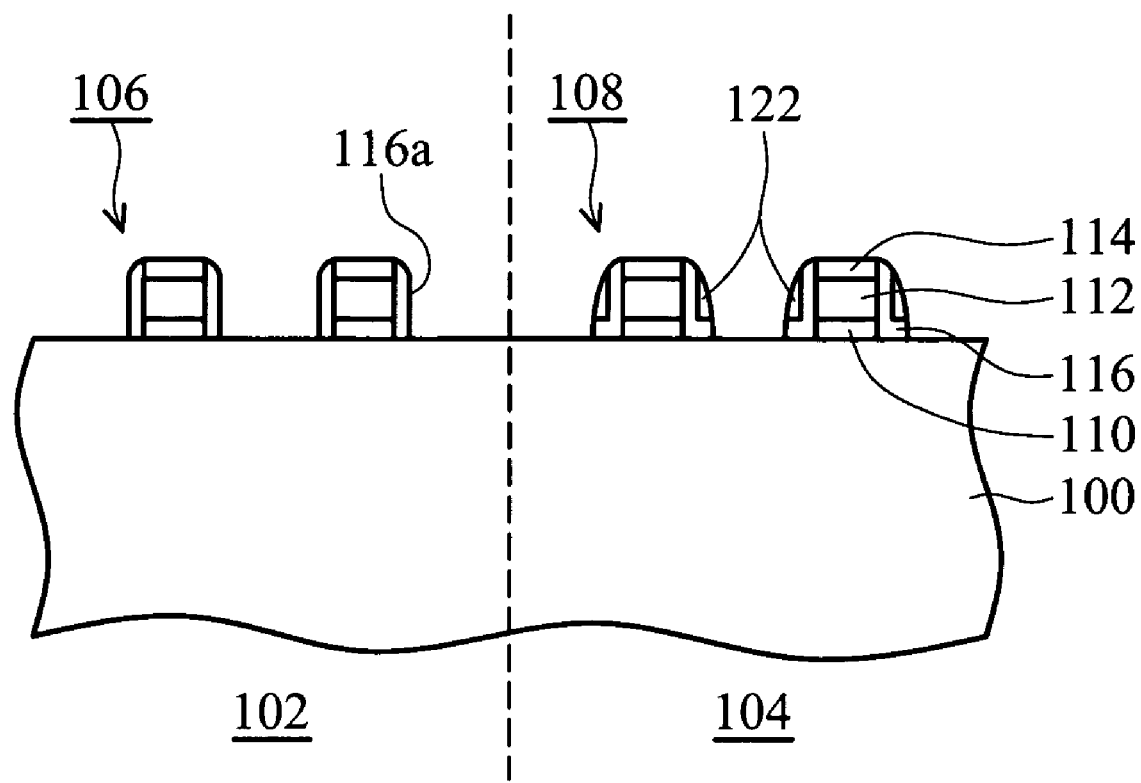

In FIG. 7, a portion of the isolation layer 116 on the surface of the substrate 100 is removed and the remaining isolation layer 116a in the array area 102 becomes single spacers on the sidewalls of the gate 106. For example, after the removal of the spacers 120, the photoresist layer 124 is removed. The isolation layer 116 on the surface of the substrate 100 and on the cap layers 114 of the gates 106 and 108 is then etched. Therefore, the remaining isolation layer 116a forms single spacers on the sidewalls of the gate 106 in the array area 102, and spacers 122 together with the remaining isolation layer 116 thereunder form dual spacers on the sidewalls of the gate 108 in the peripheral area 104. Since the isolation layer 116 is silicon nitride and the isolation layer 118 is silicon oxide, a dry etching process for removing silicon nitride can be used. Although wet etching, such as etching using hot phosphoric acid, can remove silicon nitride, dry etching is preferred in this embodiment.

Accordingly, following the sequence from FIGS. 1 to 7, single spacers and dual spacers are respectively formed in the array area 102 and the peripheral area 104 while the substrate 100 in the array area 102 is only damaged once when forming the single spacers. Furthermore, the thickness of the single spacers in the array area 102 can be well controlled to improve yield.

In this embodiment, the isolation layers 116 and 118 comprise different materials, such that, by way of an etching process with a high etching selectivity, the remaining isolation layer 116a, i.e. the single spacers on the sidewalls of the gate 106 in the array area 102, can be thin, thus the memory dimensions can be scaled down and device density in the array area 102 can be increased. Furthermore, dual spacers 122, each thicker than a single spacer, are formed on the sidewalls of the gate 108 in the peripheral area 104, solving problems arising from the short channel effect.

While the invention has been described by way of an example and in terms of preferred embodiment, it is to be understood that the invention is not limited to the disclosed embodiment. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for a semiconductor device, comprising:
    providing a substrate with an array area and a peripheral area, the array area comprising a first gate and the peripheral area comprising a second gate;
    forming a first isolation layer to cover the first gate, the second gate and the substrate;
    forming a second isolation layer to cover the first isolation layer, wherein the second isolation layer is made of a material different from the first isolation layer;
    removing a portion of the second isolation layer to form spacers on sidewalls of the first and second gates and expose the first isolation layer on a top of the first gate, a top of the second gate, and a surface of the substrate;
    forming a photoresist layer to cover the peripheral area;
    removing the spacers in the array area while protecting the spacers in the peripheral area;
    removing the photoresist layer; and
    removing the first isolation layer on the top of the first gate and the surface of the substrate, thereby leaving a portion of the first isolation layer covering the sidewalls of the first gate as single-layer spacers in the array area, and removing a portion of both the spacers and the first isolation layer on the sidewalls of the second gate to form dual-layer spacers in the peripheral area.

2. The fabrication method of claim 1, wherein the first isolation layer is silicon nitride.

3. The fabrication method of claim 2, wherein the second isolation layer is silicon oxide.

4. The fabrication method of claim 1, wherein removing a portion of the second isolation layer comprises performing a dry etching process.

5. The fabrication method of claim 1, wherein removing the spacers on the first isolation layer at the sidewalls of the first gate comprises using buffered HF or diluted HF.

6. The fabrication method of claim 1, wherein removing the first isolation layer on the surface of the substrate comprises performing a dry etching process.

* * * * *